United States Patent [19]
Tsuchida

[11] Patent Number: 5,946,254
[45] Date of Patent: Aug. 31, 1999

[54] SEMICONDUCTOR MEMORY DEVICE OF HIERARCHICAL BIT-LINE ARCHITECTURE USING CROSSPOINT-TYPE MEMORY CELL

[75] Inventor: Kenji Tsuchida, Kawasaki, Japan

[73] Assignee: Kabushiki Kaisha Toshiba, Tokyo, Japan

[21] Appl. No.: 09/201,054

[22] Filed: Nov. 30, 1998

[30]   Foreign Application Priority Data

Dec. 1, 1997   [JP]   Japan .................................... 9-330235

[51] Int. Cl.$^6$ ..................................................... G11C 7/02
[52] U.S. Cl. .................... 365/208; 365/149; 365/230.03; 365/190; 365/233
[58] Field of Search .............................. 365/149, 230.03, 365/190, 205, 208, 233

[56]   References Cited

U.S. PATENT DOCUMENTS 5,377,151   12/1994   Komuro ................................... 365/208

OTHER PUBLICATIONS

IEEE Journal of Solid–State Circuits, vol. 26, No. 4, Apr. 1991, pp. 473–478, "A Divided/Shared Bit–Line Sensing Scheme for ULSI DRAM Cores", Hidaka et al.

*Primary Examiner*—Andrew Q. Tran
*Attorney, Agent, or Firm*—Loeb & Loeb LLP

[57]   ABSTRACT

This invention discloses a semiconductor memory device in which memory cells are arranged at all the intersecting points of word lines and bit lines. The bit lines have a hierarchical bit-line architecture constituted by pairs of segmented bit-lines and pairs of master bit-lines. The memory cells are arranged at all the intersecting points of the word lines and the pairs of segmented bit-lines. The pairs of master bit-lines are of the folded bit-line scheme. One of a first pair of segmented bit-lines is connected to one of a first pair of master bit-lines, and the other one of the first pair of segmented bit-lines is connected to one of a second pair of master bit-lines. One of a second pair of segmented bit-lines is connected to the other one of the second pair of master bit-lines included in a second block, and the other one of the second pair of segmented bit-lines is connected to the other one of the first pair of master bit-lines included in a first block. The other one of the first pair of master bit-lines is connected to one of the second pair of master bit-lines via a transfer gate.

17 Claims, 8 Drawing Sheets

| C1/C2 | L/L | L/H | H/L | H/H |
|---|---|---|---|---|
| ΔVB1 | −Vs | −3Vs | 3Vs | Vs |
| ΔVB2 | −Vs | Vs | −Vs | Vs |

$Vs = (Cs \cdot VCC/2)/(Cs+Cb)$

Cs: CELL CAPACITANCE
Cb: (MASTER BITLINE CAPACITANCE) + (SEGMENTED BITLINE CAPACITANCE)

$\Delta VB1 = V_{MBL1} - V_{/MBL1}$
$\Delta VB2 = V_{/MBL2} - V_{MBL2}$

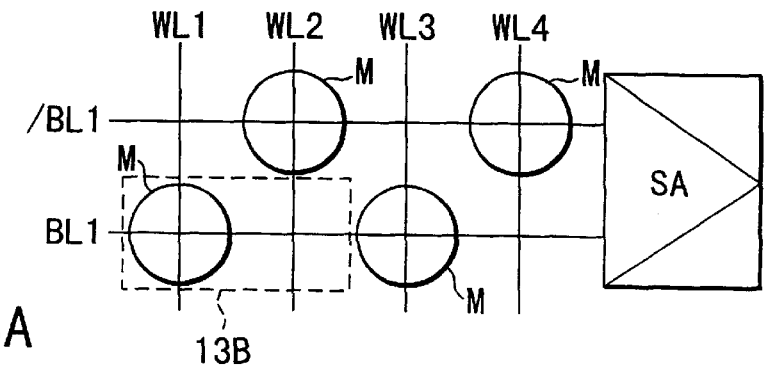
FIG. 13A
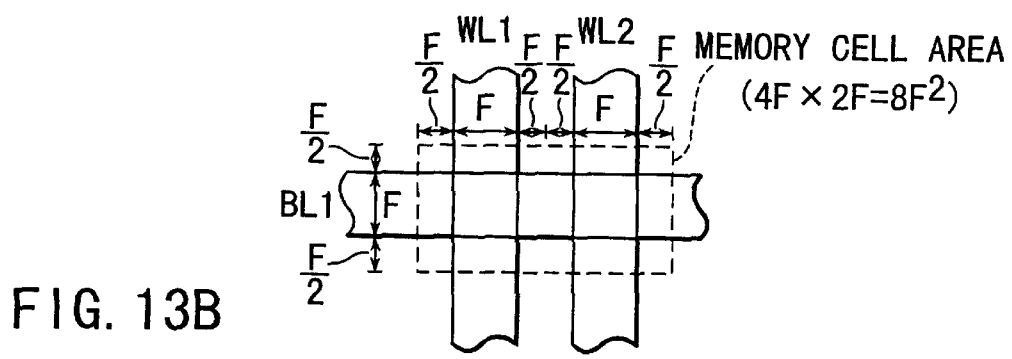
FIG. 13B
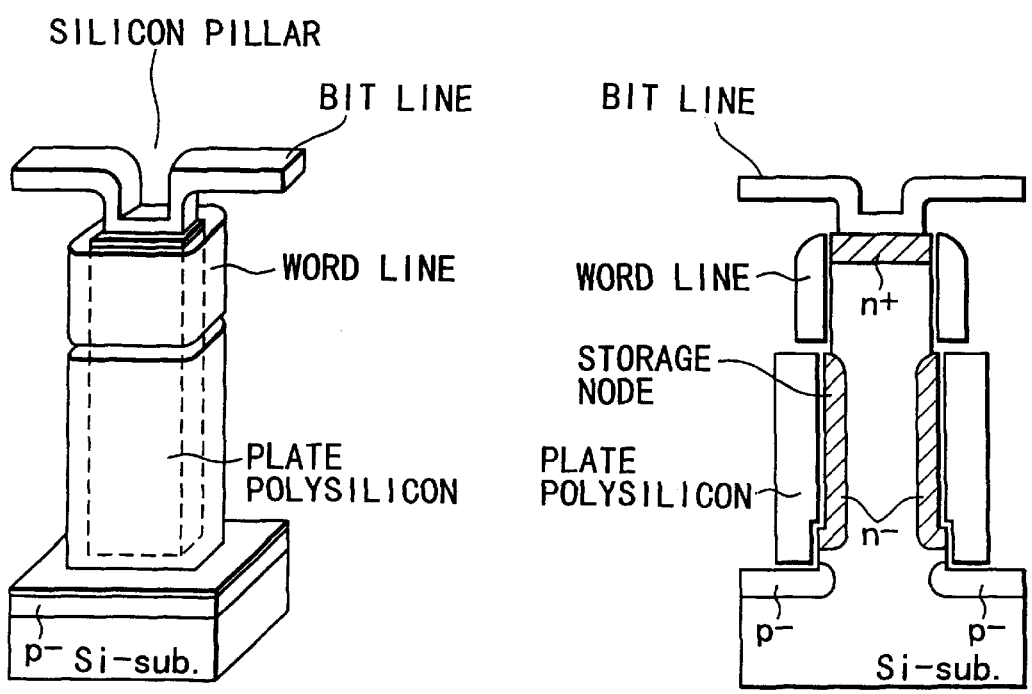
FIG. 15A
FIG. 15B

5,946,254

SEMICONDUCTOR MEMORY DEVICE OF HIERARCHICAL BIT-LINE ARCHITECTURE USING CROSSPOINT-TYPE MEMORY CELL

BACKGROUND OF THE INVENTION

The present invention relates to a semiconductor integrated circuit device having a dynamic RAM (DRAM) cell and, more particularly, to an operation scheme of a memory cell array on which crosspoint-type memory cells are integrated and laid out.

Of MOS semiconductor memory devices, a DRAM has the highest integration density because of relatively simple memory cells constituting the DRAM. This trend toward high integration is due partly to increasing miniaturization and three-dimensionally laying out memory cells. However, the development of an optical micropattern exposure technique and complicated process integration technique involving with the three-dimensional layout of memory cells almost reaches its limit. A new breakthrough is required to realize a very high integration density of 4-Gbits or more.

This problem will be described in detail.

FIG. 13A is a block diagram showing the basic arrangement of a folded bit-line scheme. Particularly, FIG. 13A schematically shows the layout of memory cells. FIG. 13B is an enlarged view showing the portion within the broken line 13B in FIG. 13A.

As shown in FIG. 13A, in the folded bit-line scheme, memory cells M are not arranged at all the intersecting points of word lines WL (WL1 to WL4) and bit lines BL (BL1 and /BL; "/" means an inverted signal or negative logic signal) but at half of all the intersecting points. The bit line BL1 and the bit line /BL1 paired with the bit line BL1 are folded on the memory cell array and connected to one sense amplifier SA.

The folded bit-line scheme is excellent in noise immunity. Due to this advantage, the folded bit-line scheme is the main current of the memory cell layout scheme ranging from 64-kbit DRAMs to 64-Mbit DRAMs which are being massproduced.

As shown in FIG. 13B, however, since the memory cells M are arranged at half of all the intersecting points in the folded bit-line scheme, a "MEMORY CELL AREA" within which the memory cells M are laid out must be at least "length necessary for two word lines WL"ב"length necessary for one bit line BL".

Letting "F" be the minimum feature size, the folded bit-line scheme can reduce the area to a limit area "4F×2F=8F$^2$". For future high integration, memory cells capable of realizing an area of "8F$^2$" or less per cell are required as a new breakthrough for satisfying this requirement. One of new breakthroughs is an open bit-line scheme generally employed up to 64-kbit DRAMs.

FIG. 14A is a block diagram showing the basic arrangement of the open bit-line scheme. Particularly, FIG. 14A schematically shows the layout of memory cells. FIG. 14B is an enlarged view showing the portion within the broken line 14B in FIG. 14A.

As shown in FIG. 14A, in the open bit-line scheme, memory cells M are arranged at all the intersecting points of word lines WL (WL1 to WL8) and bit lines BL (BL1, /BL1, BL2, and /BL2). A pair of bit lines BL and /BL connected to one sense amplifier SA (SA1 or SA2) are arranged right and left using the sense amplifier SA as the center.

This open bit-line scheme has demerits that the noise immunity is inferior to the folded bit-line scheme and that the sense amplifier SA must be laid out within the layout pitch of the bit line BL, resulting in a strict design rule.

As shown in FIG. 14B, however, the "MEMORY CELL AREA" within which the memory cells M are laid out suffices to be "length necessary for one word line WL"ב"length necessary for one bit line BL". Therefore, the layout of the memory cells M in the open bit-line scheme can greatly reduce the area per memory cell M.

More specifically, letting "F" be the minimum feature size, the open bit-line scheme can reduce the area up to "2F×2F=4F$^2$". For the same integration density, the open bit-line scheme can theoretically reduce the area of the memory cell array to ½ that of the folded bit-line scheme. This will be a significant breakthrough for high integration.

A memory cell used in the open bit-line scheme is particularly called a crosspoint-type memory cell. An example of a crosspoint-type memory cell realizing area "2F×2F=4F$^2$", is an SGT (Surrounding Gate Transistor) cell shown in FIGS. 15A and 15B. The SGT cell is disclosed in reference:

K. Sunouchi et al., "A Surrounding Gate Transistor (SGT) Cell for 64/256 Mbit DRAMs", IEDM 89-23.

To put a crosspoint-type memory cell realizing the area "4F$^2$", into a practical use based on this background, an important key point is to arrange memory cells not by the open bit-line scheme but by substantially the folded bit-line scheme excellent in noise immunity.

An example which satisfies this key point is a divided/shared bit-line (DSB) sensing scheme proposed by H. Hidaka et al. This is disclosed in reference:

"A Divided/Shared Bit-Line Sensing Scheme for ULSI DRAM Cores", IEEE Journal Solid-state Circuits, Vol. 26, No. 4, pp. 473–478, April 1991.

Even when crosspoint-type memory cells are adopted, the DSB sensing scheme can operate similarly to the sensing scheme of the folded bit-line scheme and is excellent in noise immunity.

The DSB sensing scheme however requires a "restore cycle" which is unnecessary in the folded bit-line scheme.

Further, in the DSB sensing scheme, two transfer gates must operate with clocks before and after a restore.

Under these circumstances, the DSB sensing scheme requires an extra time for ensuring the clock timing margin and is not suitable for realizing a high-speed cycle time.

In addition, three charge/discharge operations for a pair of bit lines are performed during one cycle in the worst case. This increases the number of bit line charge/discharge operations to increase the power consumption.

BRIEF SUMMARY OF THE INVENTION

The present invention has been made in consideration of the above situation, and has as its main object to provide a semiconductor integrated circuit device in which the number of bit line charge/discharge operations during one cycle can be decreased to one without any restore even with a memory cell array on which crosspoint-type memory cells are integrated.

According to the present invention, there is provided to a semiconductor memory device comprising: a memory cell array divided into first and second blocks, the first block including at least first and second word lines, a first pair of segmented bit-lines crossing the first and second word lines, memory cells arranged at all intersecting points of the first and second word lines and the first pair of segmented bit-lines, and a first pair of master bit-lines of a folded bit-line scheme, the second block including at least third and fourth word lines, a second pair of segmented bit-lines crossing the third and fourth word lines, memory cells arranged at all intersecting points of the third and fourth word lines and the second pair of segmented bit-lines, and a second pair of master bit-lines of the folded bit-line scheme, one of the first pair of segmented bit-lines included in the first block being connected to one of the first pair of master bit-lines included in the first block, and the other one of the first pair of segmented bit-lines being connected to one of the second pair of master bit-lines included in the second block, and one of the second pair of segmented bit-lines included in the second block being connected to the other one of the second pair of master bit-lines included in the second block, and the other one of the second pair of segmented bit-lines being connected to the other one of the first pair of master bit-lines included in the first block; a first sense amplifier connected to the first pair of master bit-lines; a second sense amplifier connected to the second pair of master bit-lines; and a transfer gate for connecting the other one of the first pair of master bit-lines to one of the second pair of master bit-lines.

According to the semiconductor integrated circuit device, a pair of bit lines have a hierarchical bit-line architecture including a pair of segmented bit-lines and a pair of master bit-lines. The pair of master bit-lines are of the folded bit-line scheme to sense amplifier.

With this arrangement, memory cells (memory cells each ideally having a cell size of $4F^2$) can be arranged at all the intersecting points of the word lines and the pair of segmented bit-lines, and the integration density of memory cells can be easily increased similarly to the open bit-line scheme. Since the pair of master bit-lines are of the folded bit-line scheme, excellent noise immunity can be attained.

In the present invention, a pair of bit lines having the hierarchical bit-line architecture are divided into first and second blocks within the memory cell array, and connected as follows.

One of a first pair of segmented bit-lines included in the first block is connected to one of a first pair of master bit-lines included in the first block, and the other one of the first pair of segmented bit-lines is connected to one of a second pair of master bit-lines included in a second block.

One of a second pair of segmented bit-lines included in the second block is connected to the other one of the second pair of master bit-lines included in the second block, and the other one of the second pair of segmented bit-lines is connected to the other one of the first pair of master bit-lines included in the first block.

The first pair of master bit-lines are connected to a first sense amplifier, and the second pair of master bit-lines included in the second block are connected to a second sense amplifier.

With this arrangement, when data are simultaneously read out from two memory cells connected to one word line and a pair of segmented bit-lines, the data can be respectively transmitted to the first and second sense amplifiers via a pair of master bit-lines. The data can be transmitted without the mediacy of any transfer gate, unlike the conventional DSB sensing scheme.

Accordingly, the present invention does not require a restore necessary in the conventional DSB sensing scheme. Since a restore can be eliminated, transfer gate driving operations performed before and after a restore can be eliminated to contribute to an increase in speed.

A transfer gate must be arranged between the memory cell array and sense amplifier in the conventional DSB sensing scheme. In the present invention, however, such a transfer gate can be omitted to contribute to reduction in chip size.

In the conventional DSB sensing scheme, three charge/discharge operations for a pair of bit lines must be performed during one cycle in the worst case. In the present invention, however, the number of charge/discharge operations for a pair of bit lines decreases to once. This can reduce the power consumption to about 60 to 75% the power consumption of the conventional DSB sensing scheme.

In the present invention, one of the first pair of segmented bit-lines and one of the second pair of segmented bit-lines are arranged at staggered positions in the first and second blocks, and one of the first pair of master bit-lines and one of the second pair of master bit-lines are arranged at staggered positions in the first and second blocks.

With this layout, the other one of the first pair of segmented bit-lines can cross the other one of the second pair of segmented bit-lines via a transfer gate. This can eliminate a cross-connection interconnection for crossing the other one of the first pair of segmented bit-lines with the other one of the second pair of segmented bit-lines.

In the present invention, the transfer gate is controlled from an OFF state to an ON state before the word line is activated upon cancel of precharging of a pair of master bit-lines, and from the ON state to the OFF state before the sense amplifier is activated.

Under this control, coupling noise generated on the master bit-lines connected via the transfer gate can be canceled.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13A is a block diagram showing the basic arrangement of the folded bit-line scheme;

FIG. 13B is an enlarged view showing the portion within the broken line 13B in FIG. 13A;

FIG. 15A is a perspective view showing an SGT cell; and

FIG. 15B is a sectional view showing the SGT cell.

DETAILED DESCRIPTION OF THE INVENTION

[First Embodiment]

Figure 1:
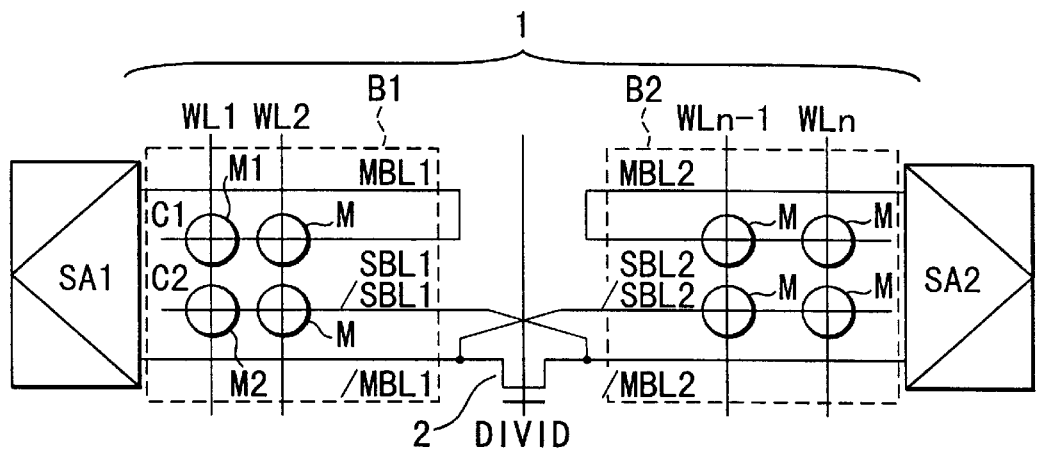
FIG. 1 is a block diagram showing the basic arrangement of a DRAM according to the first embodiment of the present invention.

FIG. 1 is a block diagram showing the basic arrangement of a DRAM according to the first embodiment of the present invention. Particularly, FIG. 1 schematically shows the arrangement of the memory cell array.

As shown in FIG. 1, bit lines BL exchange data between memory cells M and sense amplifiers SA (SA1 and SA2). In the present invention, the bit lines BL employ a hierarchical bit-line architecture. The bit lines BL in this architecture are made up of master bit-lines MBL (MBL1, /MBL1, MBL2, and /MBL2) and segmented bit-lines SBL (SBL1, /SBL1, SBL2, and /SBL2).

The master bit-line MBL forms an upper layer in the hierarchical architecture, and the segmented bit-line SBL forms a lower layer.

The memory cells M are arranged at all the intersecting points of word lines WL (WL1, WL2, . . . , WLn-1, WLn) and segmented bit-lines SBL (SBL1, /SBL1, SBL2, and /SBL2). As the memory cell M, a crosspoint-type memory cell realizing an area "2F×2F=4F$^2$" is ideally used. An example of the crosspoint-type memory cell realizing the area "2F×2F=4F$^2$", is an SGT cell shown in FIGS. 15A and 15B.

The master bit-lines MBL and /MBL and segmented bit-lines SBL and /SBL are divided into two blocks B1 and B2 at the center of a memory cell array 1. The block B1 includes the master bit-lines MBL1 and /MBL1 and segmented bit-lines SBL1 and /SBL1. The block B2 includes the master bit-lines MBL2 and /MBL2 and segmented bit-lines SBL2 and /SBL2. The master bit-lines MBL1 and /MBL1 are paired and connected to the sense amplifier SA1 arranged on the left side of the memory cell array 1. The master bit-lines MBL2 and /MBL2 are paired and connected to the sense amplifier SA2 arranged on the right side of the memory cell array 1.

One (SBL1 in FIG. 1) of the segmented bit-lines SBL1 and /SBL1 is connected to one (MBL1 in FIG. 1) of the master bit-lines MBL1 and /MBL1 included in the same block B1. One (SBL2 in FIG. 1) of the segmented bit-lines SBL2 and /SBL2 is connected to one (MBL2 in FIG. 1) of the master bit-lines MBL2 and /MBL2 included in the same block B2.

The other one (/SBL1 in FIG. 1) of the segmented bit-lines SBL1 and /SBL1 is connected to the other one (/MBL2 in FIG. 1) of the master bit-lines MBL2 and /MBL2 included in the different block B2. The other one (/SBL2 in FIG. 1) of the segmented bit-lines SBL2 and /SBL2 is connected to the other one (/MBL1 in FIG. 1) of the master bit-lines MBL1 and /MBL1 included in the different block B1.

More specifically, in the DRAM according to the first embodiment, the segmented bit-line /SBL1 included in the block B1 is cross-connected to the master bit-line /MBL2 included in the block B2, and the segmented bit-line /SBL2 included in the block B2 is cross-connected to the master bit-line /MBL1 included in the block B1.

The other one (/MBL1 in FIG. 1) of the master bit-lines MBL1 and /MBL1 included in the block B1 is connected to the other one (/MBL2 in FIG. 1) of the master bit-lines MBL2 and /MBL2 included in the block B2 via a transfer gate 2. The transfer gate 2 is turned on/off by a control signal DIVID.

Figure 2:
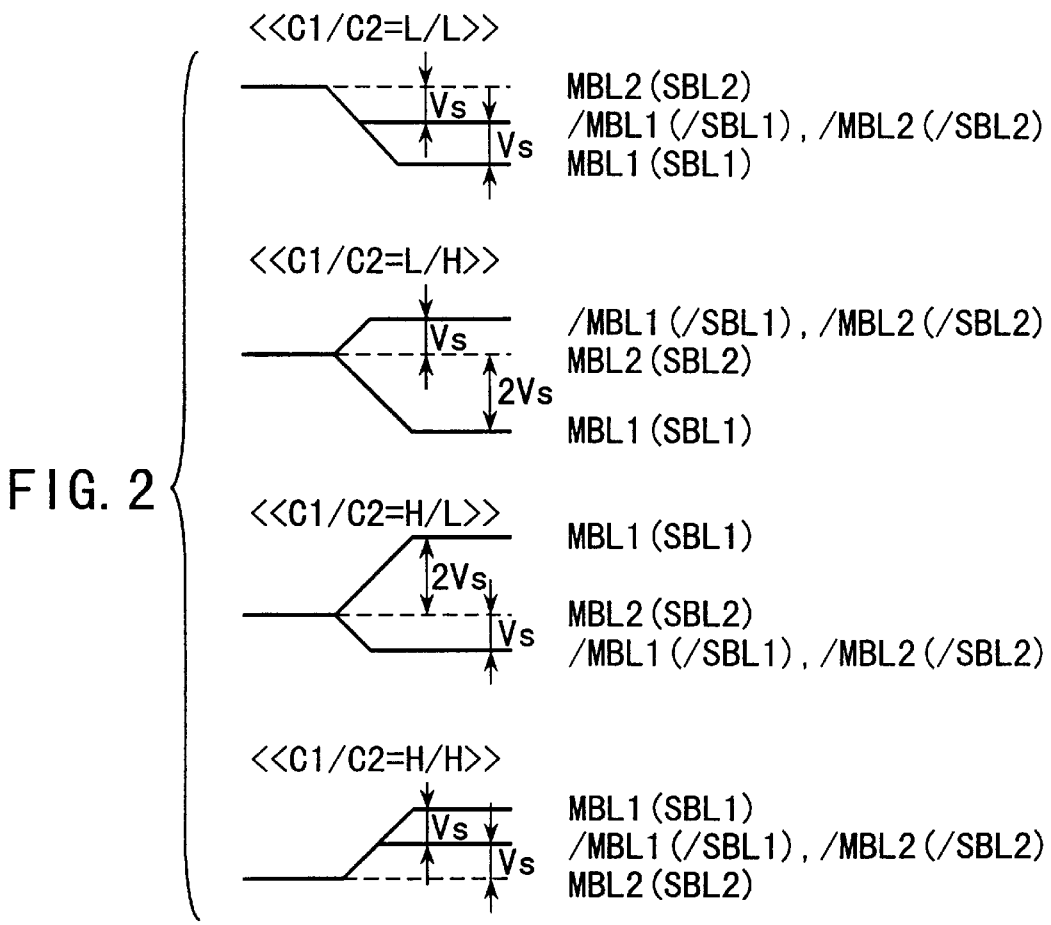
FIG. 2 is a waveform chart showing the potential waveform of the bit line in a data read in the DRAM according to the first embodiment of the present invention.

FIG. 2 is a waveform chart showing the waveform of the bit line in a data read in the DRAM according to the first embodiment of the present invention. Particularly, FIG. 2 shows the potential waveform of the bit line when the word line WL1 is activated in the memory cell array 1 shown in FIG. 1, and data C1 and C2 are respectively read out from the memory cells M1 and M2.

In reading out data, the control signal DIVID is held at "H" level. As a result, the master bit-line /MBL2 is connected to the master bit-line /MBL1.

The bit line potential therefore has four combinations in accordance with combinations of data C1 and C2.

Combination: <<C1/C2=L/L>>

In this combination, the potential of the master bit-line MBL1 drops by "−2 Vs", and the potential of the master bit-line /MBL1 drops by "−Vs".

The potential of the master bit-line MBL2 does not drop or vary. The potential of the master bit-line /MBL2 drops by "−Vs" because the master bit-line /MBL2 is connected to the master bit-line /MBL1.

Letting "Cs" be the capacitance of the memory cell, "Cb" be the sum of the capacitances of MBL1, MBL2, SBL1, and SBL2, and VCC be the power supply voltage, the potential "Vs" is a signal amount given by $$Vs=(Cs\times VCC/2)/(Cb+Cs) \tag{1}$$

In combinations of data C1/C2 other than <<C1/C2=L/L>>, the bit line potential changes as shown in FIG. 2.

Figures 3, 4:
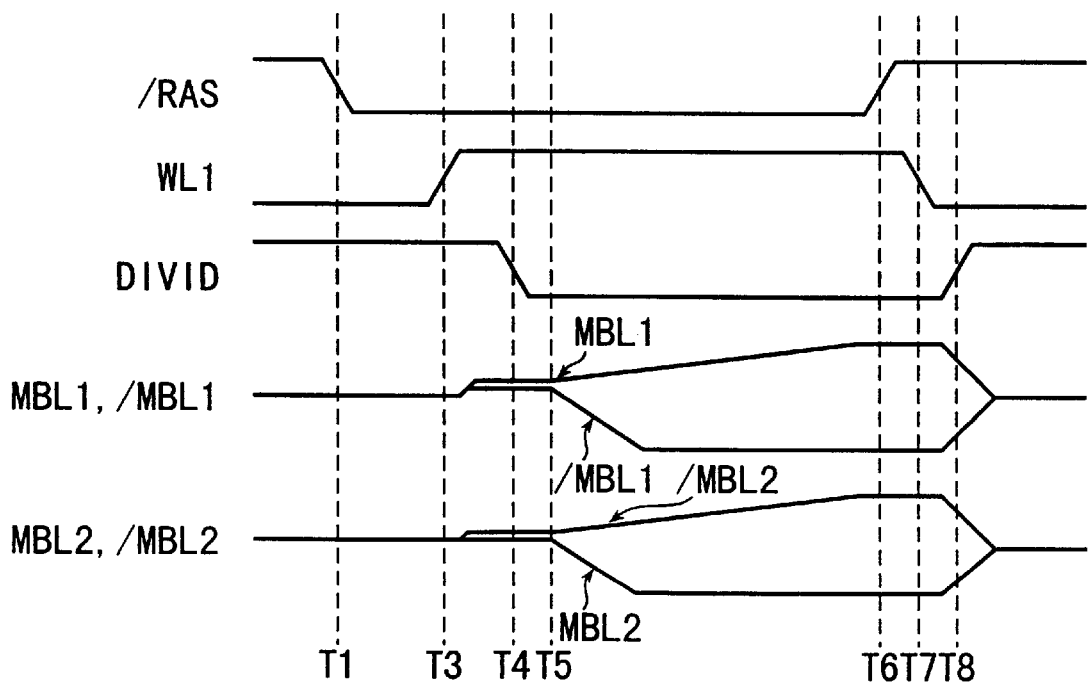
FIG. 3 is a table showing the relationship between small signals (AVB1 and AVB2) and memory information (C1/C2) of the memory cell in the DRAM according to the first embodiment of the present invention.
FIG. 4 is an operation timing chart showing an example of a data read in the DRAM according to the first embodiment of the present invention.

FIG. 3 is a table showing changes in bit line potential as a signal amount input to the sense amplifier SA. Referring to FIG. 3, "ΔVB1" represents a signal amount input to the sense amplifier SA1, and "ΔVB2" represents a signal amount input to the sense amplifier SA2.

As shown in FIG. 3, in the worst case, a signal amount at least equal to or larger than the potential "Vs" as an absolute value is input to the sense amplifier SA in accordance with a combination of memory data C1/C2. In the first embodiment, similar to the conventional DSB sensing scheme, a reference voltage input to the sense amplifier SA can be automatically generated using the capacitance of a pair of bit lines.

Since the DRAM has a circuit arrangement capable of performing completely the same operation as the sensing operation in the folded bit-line scheme, it has excellent noise immunity similar to the conventional DSB sensing scheme.

FIG. 4 is an operation timing chart showing an example of a data read in the DRAM according to the first embodiment of the present invention.

As shown in FIG. 4, when a row address strobe signal /RAS as an external control signal falls at time T1, a row address is received in the chip. Equalization of the master bit-lines MBL1 and /MBL1 and equalization of the master bit-lines MBL2 and /MBL2 are canceled and electrically float.

Subsequently, a specific word line (WL1 in FIG. 4) within a block to be activated at time T3 is activated, and data C1 is read out from the memory cell M1 as a small signal to the master bit-line MBL1 via the segmented bit-line SBL1. At the same time, data C2 is read out from the memory cell M2 as a small signal to the master bit-line /MBL2 via the segmented bit-line /SBL1.

Note that the small signal read out to the master bit-line /MBL2 is transmitted to the master bit-line /MBL1 via the transfer gate 2.

At time T4, the control signal DIVID changes to "L" level to disconnect the master bit-line /MBL2 from the master bit-line /MBL1.

At time T5, the sense amplifiers SA1 and SA2 are activated. The sense amplifier SA1 senses and amplifies a small potential difference between the master bit-lines MBL1 and /MBL1. The sense amplifier SA2 senses and amplifies a small potential difference between the master bit-lines MBL2 and /MBL2.

If both data C1 and C2 are at "L" level, the sense amplifier SA1 amplifies the small potential difference so as to change the master bit-line MBL1 to "L" level and the master bit-line /MBL1 to "H" level.

The sense amplifier SA2 amplifies the small potential difference so as to change the master bit-line MBL2 to "H" level and the master bit-line /MBL2 to "L" level.

If data C1 is at "L" level, and data C2 is at "H" level, the sense amplifier SA1 amplifies the small potential difference so as to change the master bit-line MBL1 to "L" level and the master bit-line /MBL1 to "H" level.

The sense amplifier SA2 amplifies the small potential difference so as to change the master bit-line MBL2 to "L" level and the master bit-line /MBL2 to "H" level.

If data C1 is at "H" level, and data C2 is at "L" level, the sense amplifier SA1 amplifies the small potential difference so as to change the master bit-line MBL1 to "H" level and the master bit-line /MBL1 to "L" level.

The sense amplifier SA2 amplifies the small potential difference so as to change the master bit-line MBL2 to "H" level and the master bit-line /MBL2 to "L" level.

If both data C1 and C2 are at "H" level, the sense amplifier SA1 amplifies the small potential difference so as to change the master bit-line MBL1 to "H" level and the master bit-line /MBL1 to "L" level.

The sense amplifier SA2 amplifies the small potential difference so as to change the master bit-line MBL2 to "L" level and the master bit-line /MBL2 to "H" level.

The operation timing of FIG. 4 shows, of four bit line potential changes, a potential change when both data C1 and C2 are at "H".

If data C1 of the memory cell M1 is read out outside the memory cell array 1 after all the bit lines are driven to a desired potential, the sense amplifier SA1 is selected.

If data C2 of the memory cell M2 is read out outside the memory cell array 1, the sense amplifier SA2 is selected.

If data C1 and C2 of the memory cells M1 and M2 are read out parallel outside the memory cell array 1, both the sense amplifiers SA1 and SA2 are selected.

In this way, data C1 and C2 of the memory cells M1 and M2 can be extracted outside the memory cell array 1.

When the row address strobe signal /RAS rises at time T6, the address received inside the chip is cleared.

At time T7, the word line (WL1) is inactivated.

At time T8, all the bit lines are short-circuited, and at the same time the control signal DIVID changes to "H" level to completely initialize the chip.

Figure 5:
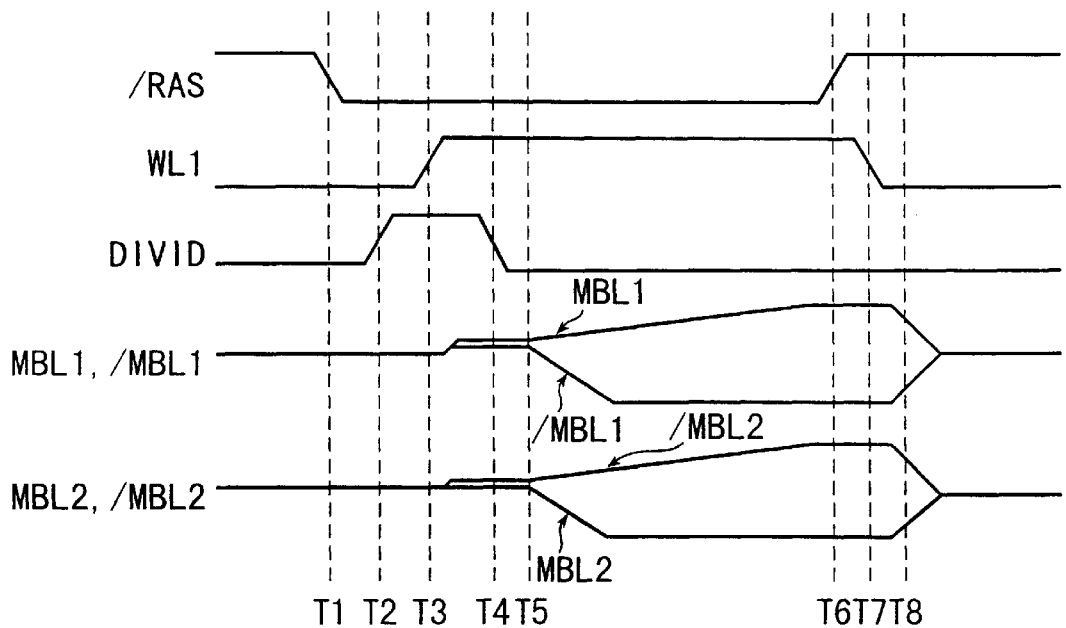
FIG. 5 is an operation timing chart showing another example of a data read in the DRAM according to the first embodiment of the present invention.

FIG. 5 is an operation timing chart showing another example of a data read in the DRAM according to the first embodiment of the present invention.

The operation timing shown in FIG. 5 is different from the operation timing shown in FIG. 4 by the operation timing of the control signal DIVID and particularly in that the control signal DIVID is held at "L" level when the row address strobe signal /RAS is at "H" level.

In the example shown in FIG. 4, the control signal DIVID changes to "L" level at time T4. For this reason, the gate capacitance of a MOS transistor constituting the transfer gate 2 may generate negative coupling noise on the floating master bit-lines /MBL1 and /MBL2.

To the contrary, in the example shown in FIG. 5, the control signal DIVID changes to "H" level at time T2. At time T2, the master bit-lines /MBL1 and /MBL2 completely float.

Since the control signal DIVID changes to "H" level at time T2, positive coupling noise can be generated on the floated master bit-lines /MBL1 and /MBL2. If the control signal DIVID changes to "L" level at time T4, negative coupling noise is generated on the floating master bit-lines /MBL1 and /MBL2.

In this manner, positive coupling noise and negative coupling noise can be generated on the master bit-lines /MBL1 and /MBL2. Therefore, coupling noise generated on the master bit-lines /MBL1 and /MBL2 can be canceled.

The remaining operation is substantially the same as the operation timing shown in FIG. 4.

As shown in FIGS. 4 and 5, the present invention does not require any restore which is necessary in the DSB sensing scheme. This is because the bit line having the hierarchical architecture allows to keep the sense amplifier SA2 connected to the memory cell M2 while RAS is active. Accordingly, two transfer gate driving operations, which are necessary before and after a restore in the DSB sensing scheme, can be eliminated to contribute to an increase in speed.

In the DSB sensing scheme, a transfer gate for connecting the sense amplifier and bit line must be arranged at the end of the memory cell array. In the present invention, however, such a transfer gate can be omitted advantageously to allow reduction in chip size.

The number of bit line charge/discharge operations via the sense amplifier during one cycle decreases from three in the worst case to one. This greatly contributes to reduction in power consumption. More specifically, the charge supply amount from the power supply in the DSB sensing scheme is calculated <<Sensing>>

$$n \times C_b/2 \times VCC/2 \quad (2)$$

<<Restore>>

$$2/n \times C_b/2 \times VCC \quad (3)$$

During one cycle, the charge supply amount is the sum of (2) and (3), and charges must be supplied from a power supply given by $$n \times C_b \times VCC/2 \quad (4)$$

where n is the number of bit lines charged by one cycle, Cb is the bit line capacitance, and VCC is the power supply voltage.

On the other hand, the charge supply amount from the power supply in the DRAM according to the present invention is given by only (2). For this reason, the charge supply amount can be reduced to 50%. Note that in the first embodiment, the bit line has the hierarchical architecture, and thus its capacitance is larger than the capacitance in the DSB sensing scheme by the capacitance of the master bit-line. However, the master bit-line is not directly connected to the diffusion layer of the memory cell M. Further, the master bit-line can be structurally formed from an interconnection above the segmented bit-line. From these factors, the capacitance of the master bit-line can be reduced to about 20 to 50% the capacitance of the segmented bit-line.

Even if, therefore, an increase in bit line capacitance by the hierarchical bit-line architecture is considered, the power consumption upon charge/discharge of the bit line can be reduced to 60 to 75% the power consumption of the DSB sensing scheme.

Figure 6:
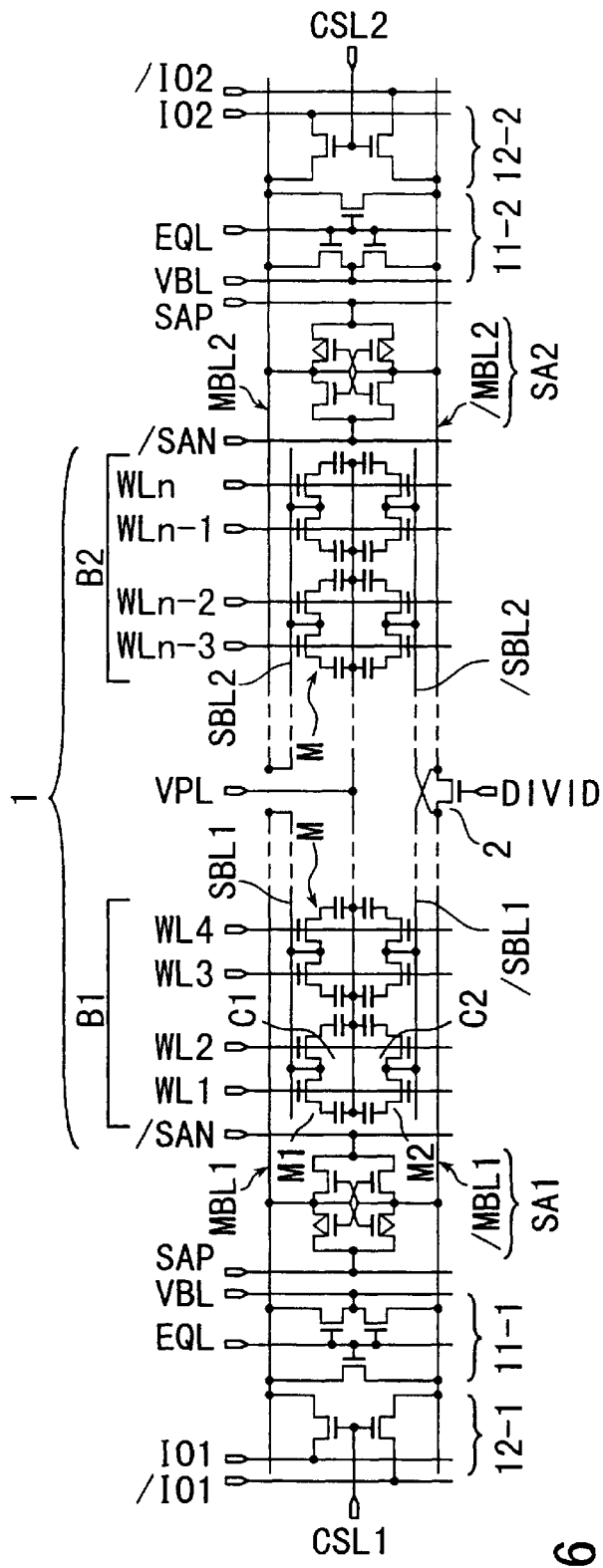
FIG. 6 is a circuit diagram showing a circuit example of the DRAM according to the first embodiment of the present invention.

FIG. 6 is a circuit diagram showing a detailed circuit example of the DRAM according to the first embodiment of the present invention.

The memory cells M are arranged at all the intersecting points of the word lines WL (WL1, WL2, ..., WLn-1, WLn) and segmented bit-lines SBL (SBL1, /SBL1, SBL2, and /SBL2). As the memory cell M, a crosspoint-type memory cell realizing area "2F×2F=4F$^2$", is used.

The segmented bit-lines SBL1 and SBL2 are respectively connected to the master bit-lines MBL1 and MBL2 at the center of the memory cell array 1. The segmented bit-line /SBL1 is connected to the master bit-line /MBL2 at the center of the memory cell array 1. The segmented bit-line /SBL2 is connected to the master bit-line /MBL1 at the center of the memory cell array 1. An interconnection forming the master bit-lines MBL1, /MBL1, MBL2, and /MBL2 is above an interconnection forming the segmented bit-lines SBL1, /SBL1, SBL2, and /SBL2.

The transfer gate 2 for connecting the master bit-line /MBL1 to the master bit-line /MBL2 is formed at the center of the memory cell array 1. The transfer gate 2 is formed from an n-channel MOSFET. The transfer gate 2 is driven by the control signal DIVID.

Bit line precharge circuits 11-1 and 11-2 and I/O gates 12-1 and 12-2 are respectively formed at the two ends of the memory cell array 1.

Control signals /SAN and SAP control the sense amplifiers SA1 and SA2. In this circuit example, when the control signal /SAN is at "L" level, and the control signal SAP is at "H" level, the sense amplifiers SA1 and SA2 are activated.

An equalization signal EQL controls the precharge circuits 11-1 and 11-2. In this circuit example, when the equalization signal EQL is at "H" level, the bit line precharge circuit 11-1 equalizes the potentials of the master bit-lines MBL1 and /MBL1 to a precharge potential VBL. Similarly, when the equalization signal EQL is at "H" level, the bit line precharge circuit 11-2 equalizes the potentials of the master bit-lines MBL2 and /MBL2 to the precharge potential VBL.

A selection signal CSL1 turns on/off the I/O gate 12-1, and a selection signal CSL2 turns on/off the I/O gate 12-2. When an access to the master bit-lines MBL1 and /MBL1 is designated by, e.g., a column address, the selection signal CSL1 connects the master bit-lines MBL1 and /MBL1 to I/O data lines IO1 and /IO1. When an access to the master bit-lines MBL2 and /MBL2 is designated by, e.g., a column address, the selection signal CSL2 connects the master bit-lines MBL2 and /MBL2 to I/O data lines IO2 and /IO2.

Operation of the circuit example shown in FIG. 6 will be explained.

Figure 7:
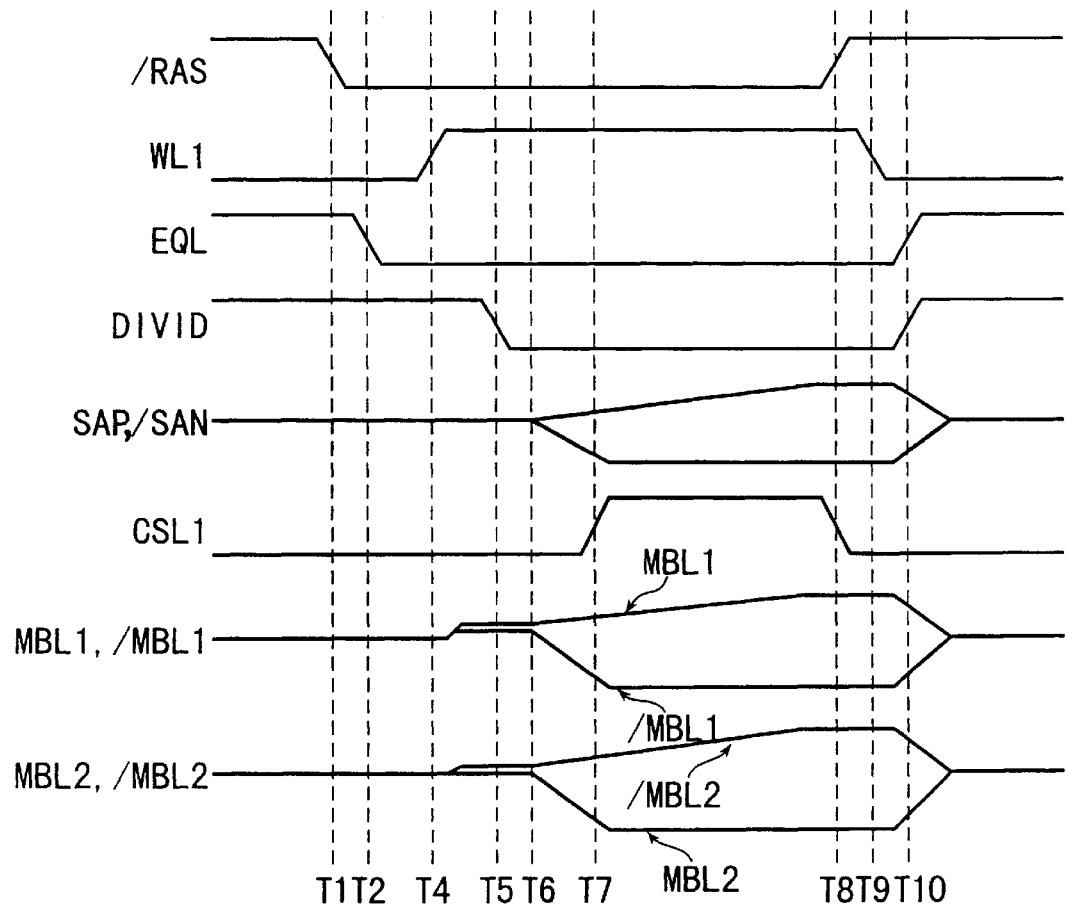
FIG. 7 is an operation timing chart showing an example of a data read in the circuit example.

FIG. 7 is an operation timing chart showing an example of a data read in this circuit example.

As shown in FIG. 7, when the row address strobe signal /RAS as an external control signal falls at time T1, a row address is received inside the chip.

Subsequently, the equalization signal EQL falls in the memory cell array 1 to be activated at time T2 in accordance with the received address. In the memory cell array 1 to be activated, equalization of the master bit-lines MBL1 and /MBL1 and equalization of the master bit-lines MBL2 and /MBL2 are canceled. The master bit-lines MBL1, /MBL1, MBL2, and /MBL2 are disconnected from the precharge circuits 11-1 and 11-2 and electrically float.

A specific word line (WL1 in FIG. 7) within a block to be activated at T4 is activated, and data C1 is read out as a small signal from the memory cell M1 to the master bit-line MBL1 via the segmented bit-line SBL1. At the same time, data C2 is read out as a small signal from the memory cell M2 to the master bit-line MBL2 via the segmented bit-line SBL2.

Note that the small signal read out to the master bit-line /MBL2 is transmitted to the master bit-line /MBL1 via the transfer gate 2.

At time T5, the control signal DIVID changes to "L" level to disconnect the master bit-line /MBL2 from the master bit-line /MBL1.

At time T6, the control signal /SAN changes to "L" level (e.g., ground voltage VSS within the circuit), and the control signal SAP changes to "H" level (e.g., power supply voltage VCC) to activate the sense amplifiers SA1 and SA2. The sense amplifier SA1 senses and amplifies a small potential difference between the master bit-lines MBL1 and /MBL1. The sense amplifier SA2 senses and amplifies a small potential difference between the master bit-lines MBL2 and /MBL2.

At this time, the potentials of the master bit-lines MBL1, /MBL1, MBL2, and /MBL2 change in accordance with a combination of memory data C1 and C2, as described with reference to FIG. 4.

The operation timing in FIG. 7 shows, of four bit line potential changes, a potential change when both data C1 and C2 are at "H".

After the sense amplifiers SA1 and SA2 are activated, the selection signal CSL1 changes to "H" level at time T7 to turn on the I/O gate 12-1. The master bit-lines MBL1 and /MBL1 are connected to the I/O data lines IO1 and /IO1.

Data C1 read out to the master bit-lines MBL1 and /MBL1 is amplified by the sense amplifier SA1 and transmitted to the I/O data lines IO1 and /IO1.

At time T8, the selection signal CSL1 changes to "L" level to turn off the I/O gate 12-1, thereby disconnecting the master bit-lines MBL1 and /MBL1 from the I/O data lines IO1 and /IO1. When the row address strobe signal /RAS rises, the address received inside the chip is cleared.

At time T9, the word line WL1 is inactivated.

At time T10, the control signals /SAN and SAP change to an equalization level to inactivate the sense amplifiers SA1 and SA2. The equalization signal EQL changes to "H" level to activate the precharge circuits 11-1 and 11-2. As a result, the master bit-lines MBL1, /MBL1, MBL2, and /MBL2 are connected to the precharge circuits 11-1 and 11-2 and thus equalized to the precharge potential VBL. Further, the control signal DIVID changes to "H" level to completely initialize the chip.

Figure 8:
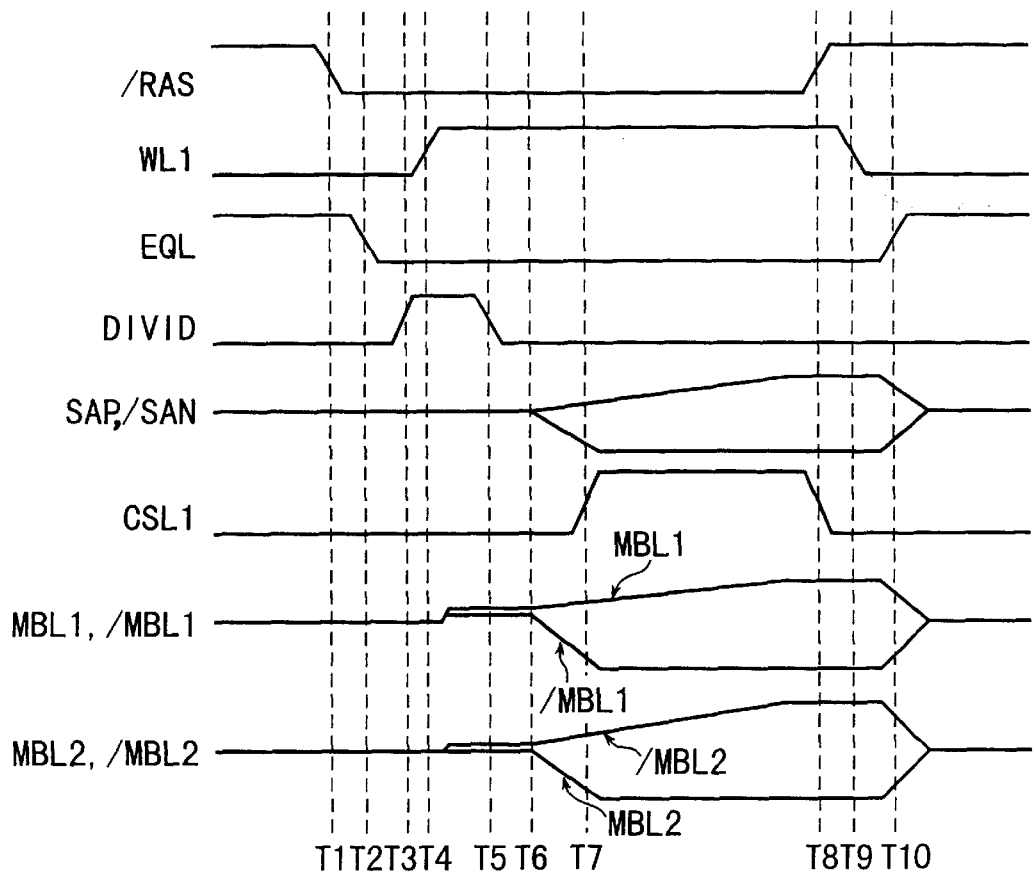
FIG. 8 is an operation timing chart showing another example of a data read in the circuit example.

FIG. 8 is an operation timing chart showing another example of a data read in the circuit example.

The operation timing shown in FIG. 8 is different from the operation timing shown in FIG. 7 by the operation timing of the control signal DIVID and particularly in that the control signal DIVID is held at "L" level when the row address strobe signal /RAS is at "H" level.

The control signal DIVID changes to "H" level at time T3 after the master bit-lines /MBL1 and /MBL2 completely float. At time T5, the control signal DIVID changes to "L" level.

Similar to the example shown in FIG. 5, positive coupling noise and negative coupling noise can be generated on the master bit-lines /MBL1 and /MBL2. Therefore, coupling noise generated on the master bit-lines /MBL1 and /MBL2 can be canceled.

The remaining operation is substantially the same as the operation timing shown in FIG. 7.

[Second Embodiment]

Figure 9:
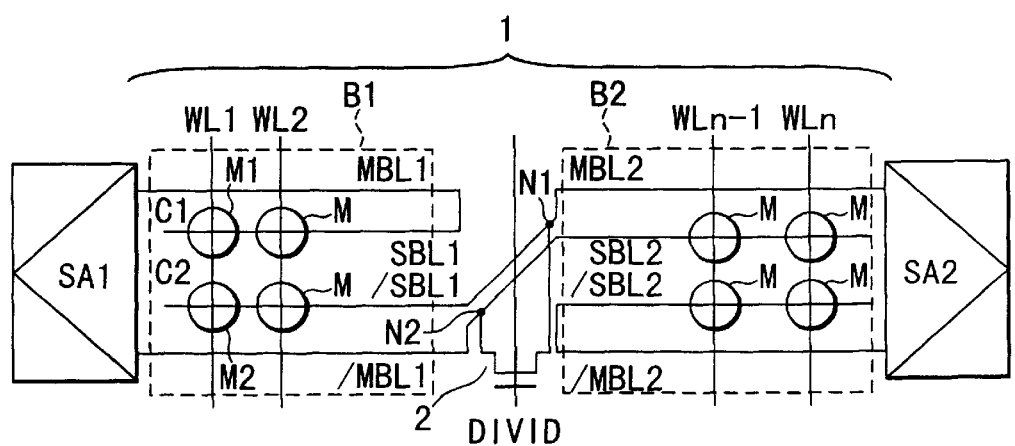
FIG. 9 is a block diagram showing the basic arrangement of a DRAM according to the second embodiment of the present invention.

FIG. 9 is a block diagram showing the basic arrangement of a DRAM according to the second embodiment of the present invention. Particularly, FIG. 9 schematically shows the arrangement of the memory cell array.

The second embodiment is different from the first embodiment in connection of the segmented bit-line and master bit-line.

In the first embodiment shown in FIG. 1, the segmented bit-lines /SBL1 and /SBL2 are substantially in line on an actual memory cell array 1. The segmented bit-lines /SBL1 and /SBL2 are respectively arranged at identical positions in the blocks B1 and B2.

Also, the master bit-lines /MBL1 and /MBL2 are substantially in line on an actual memory cell array 1. The master bit-lines /MBL1 and /MBL2 are respectively arranged at identical positions in the blocks B1 and B2.

In this layout, as shown in FIG. 1, the segmented bit-lines /SBL1 and /SBL2 can only be respectively connected to the master bit-lines /MBL2 and /MBL1 by crossing the segmented bit-lines /SBL1 and /SBL2 at the center of the memory cell array 1. Crossing the segmented bit-lines /SBL1 and /SBL2 requires another cross-connection interconnection. The presence of this cross-connection interconnection may increase the area of the region for dividing the memory cell array 1 into the blocks B1 and B2.

To the contrary, in the second embodiment, as shown in FIG. 9, a segmented bit-line /SBL1 arranged in a block B1 is connected to a master bit-line MBL2 arranged in a block B2. A segmented bit-line SBL2 arranged in the block B2 is connected to a master bit-line /MBL1 arranged in the block B1. The segmented bit-lines /SBL1 and SBL2 are arranged at staggered positions in the blocks B1 and B2. Similarly, the master bit-lines MBL2 and /MBL1 are arranged at staggered positions in the blocks B1 and B2. An n-channel MOS transistor constituting a transfer gate 2 is series-connected between an interconnection node N1 between the segmented bit-line /SBL1 and master bit-line MBL2 and an interconnection node N2 between the segmented bit-line SBL2 and master bit-line /MBL1.

According to the second embodiment, the segmented bit-line /SBL1 can cross the segmented bit-line SBL2 via the channel of the MOS transistor constituting the transfer gate 2. This eliminates the cross-connection interconnection for crossing the segmented bit-lines /SBL1 and SBL2. The absence of the cross-connection interconnection can reduce the area of the region for dividing the memory cell array 1 into the blocks B1 and B2, compared to the first embodiment. Accordingly, an increase in chip area can be suppressed.

Even if the second embodiment employs a crosspoint-type memory cell, similar to the first embodiment, a DRAM excellent in noise immunity with high-speed, low-power-consumption characteristics can be realized.

[Third Embodiment]

Figure 10:
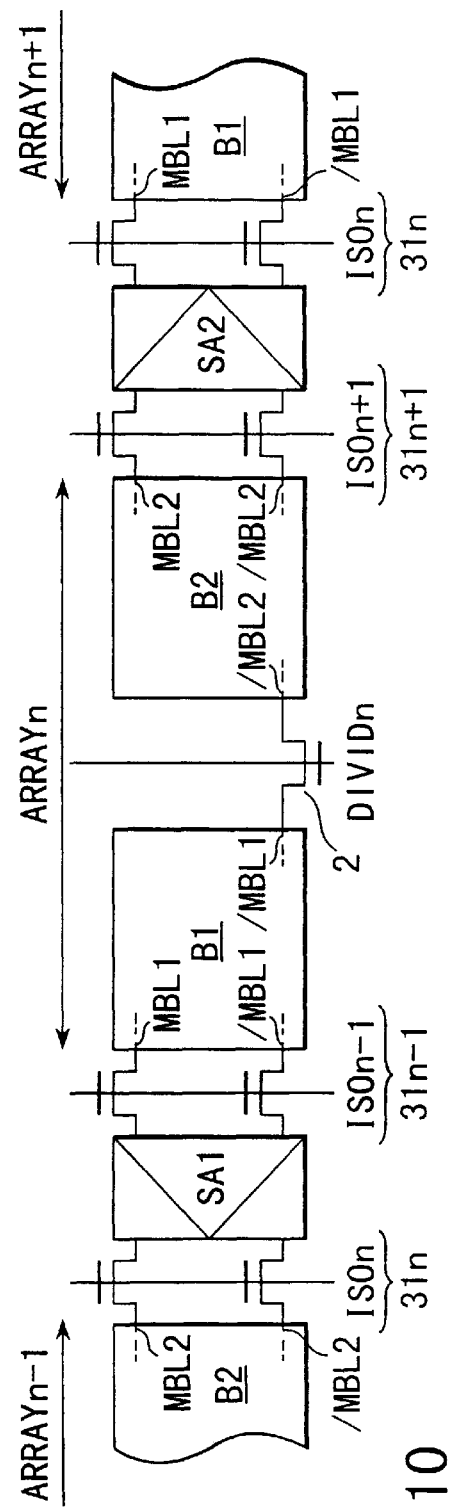
FIG. 10 is a block diagram showing the basic arrangement of a DRAM according to the third embodiment of the present invention.

FIG. 10 is a block diagram showing the basic arrangement of a DRAM according to the third embodiment of the present invention. Particularly, FIG. 10 schematically shows the arrangement of the memory cell array.

As shown in FIG. 10, the third embodiment is different from the first and second embodiments in that other transfer gates 31$n$, 31$n$–1, and 31$n$+1 are arranged between master bit-lines and sense amplifiers SA1 and SA2.

In the DRAM according to the third embodiment, the sense amplifier can be shared by adjacent memory cell arrays by selectively ON/OFF-controlling the transfer gates 31$n$, 31$n$–1, and 31$n$+1. In the third embodiment the sense amplifier SA1 is shared by memory cell arrays "ARRAYn-1" and "ARRAYn", while the sense amplifier SA2 is shared by memory cell arrays "ARRAYn" and "ARRAYn+1".

To activate the memory cell array "ARRAYn", an isolation signal ISOn is changed from "H" level to "L" level to turn off the transfer gate 31$n$. Then, the sense amplifier SA1 is isolated from the memory cell array "ARRAYn-1", and the sense amplifier SA2 is isolated from the memory cell array "ARRAYn+1".

To activate the memory cell array "ARRAYn-1", an isolation signal ISOn-1 is changed from "H" level to "L" level to turn off the transfer gate 31$n$–1.

To activate the memory cell array "ARRAYn+1", an isolation signal ISOn+1 is changed from "H" level to "L" level to turn off the transfer gate 31$n$+1.

In this way, by selectively ON/OFF-controlling the transfer gates 31$n$, 31$n$–1, and 31+1 in accordance with the isolation signals ISOn, ISOn-1, and ISOn+1, each of the sense amplifiers SA1 and SA2 can be shared by two adjacent memory cell arrays. This can decrease the number of sense amplifiers to greatly reduce the chip size together with the adoption of a crosspoint-type memory cell.

Figure 11:
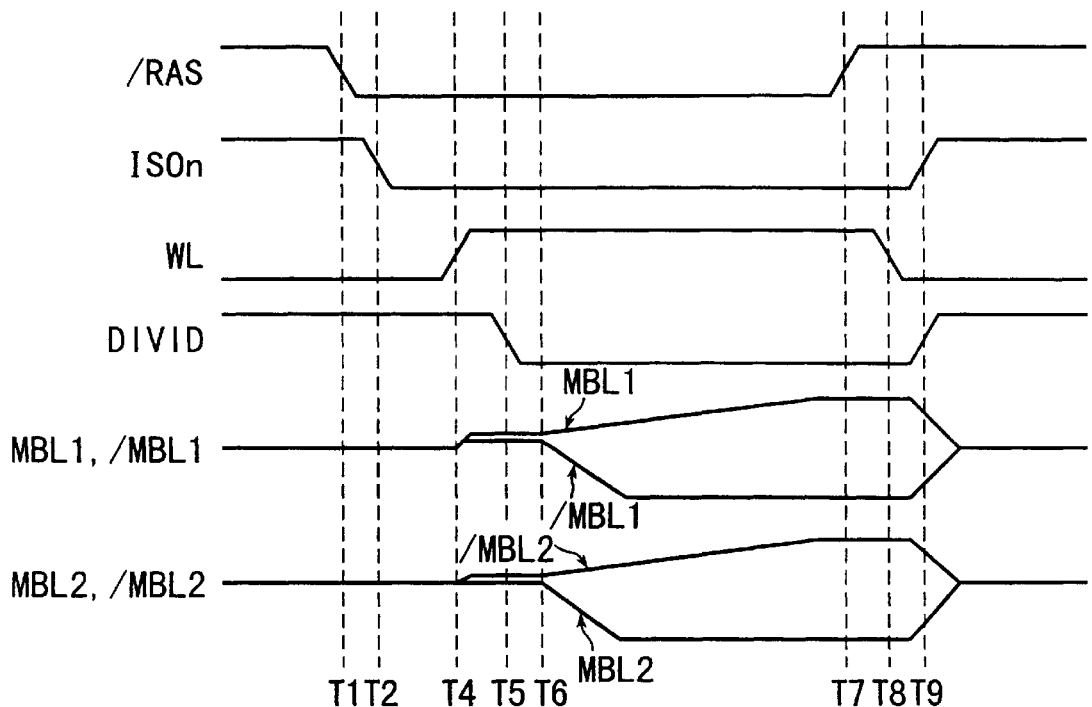
FIG. 11 is an operation timing chart showing an example of a data read in the DRAM according to the third embodiment of the present invention.

FIG. 11 is an operation timing chart showing an example of a data read in the DRAM according to the third embodiment of the present invention.

As shown in FIG. 11, when the row address strobe signal /RAS falls at time T1, a row address is received inside the chip. A memory cell array to be activated is designated in accordance with the received row address. Assume that the memory cell array "ARRAYn" is designated. All the master bit-lines within the memory cell array "ARRAYn" are disconnected from a precharge circuit (not shown) and electrically float.

In synchronism with this, the isolation signal ISOn changes from "H" level to "L" level at time T2. Consequently, the inactive memory cell arrays "ARRAYn-1" and "ARRAYn+1" adjacent to the memory cell array "ARRAYn" are isolated from the sense amplifiers SA1 and SA2. The isolation signal ISOn is one of signals for activating a block designated by an external address.

At time T4, a word lines WL of the memory cell array "ARRAYn" is activated to read out data from a memory cell. The readout data appears on master bit-lines MBL1, /MBL1, MBL2, and /MBL2 as a small potential difference between the master bit-lines MBL1 and /MBL1 and a small potential difference between the master bit-lines MBL2 and /MBL2.

At time T5, the control signal DIVID changes to "L" level to disconnect the master bit-lines MBL1 and /MBL1. The control signal DIVID is one of signals for activating a block designated by an external address.

At time T6, the sense amplifiers SA1 and SA2 are activated to sense and amplify a small potential difference between the master bit-lines MBL1 and /MBL1 and a small potential difference between the master bit-lines MBL2 and /MBL2.

After the small potential difference between the master bit-lines MBL1 and /MBL1 and the small potential difference between the master bit-lines MBL2 and /MBL2 are satisfactorily amplified, the row address strobe signal /RAS rises at time T7. As a result, the address received inside the chip is cleared.

At time T8, the word line WL changes to "L" level to be inactive.

At time T9, all the master bit-lines MBL1, /MBL1, MBL2, and /MBL2 are equalized, and at the same time the control signal DIVID changes to "H" level. Further, the isolation signal ISOn changes to "H" level. The memory cell arrays "ARRAYn-1" and "ARRAYn+1" are connected to the sense amplifiers SA1 and SA2 again to initialize the chip.

Figure 12:
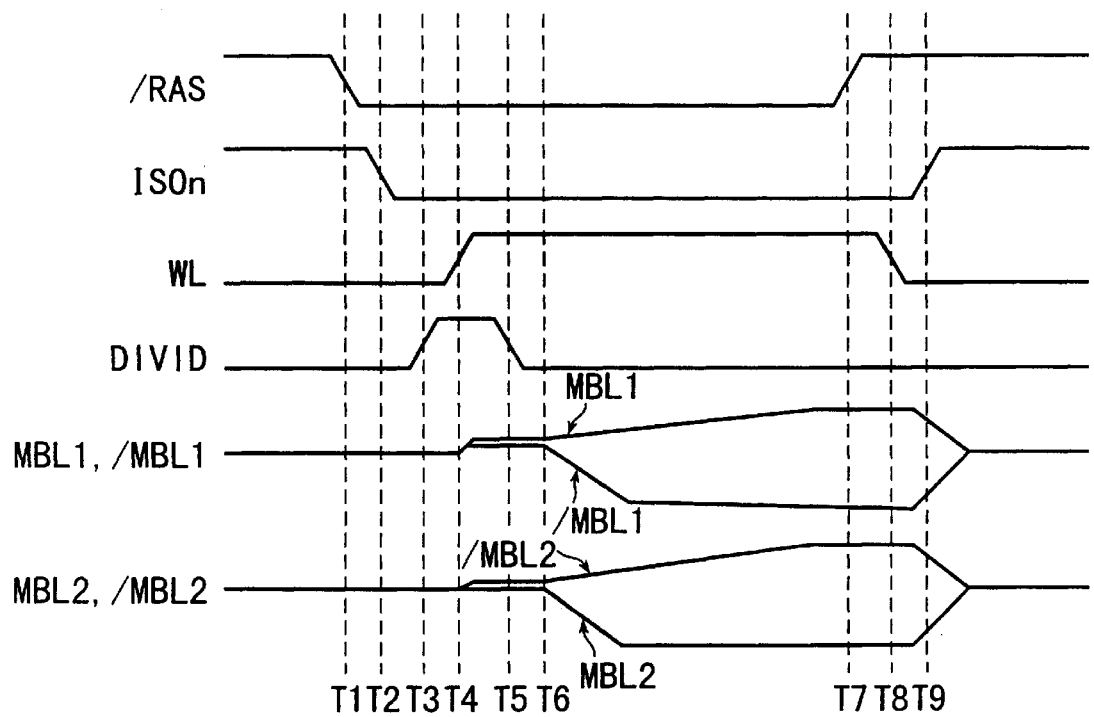
FIG. 12 is an operation timing chart showing another example of a data read in the DRAM according to the third embodiment of the present invention.
Figure 14A:
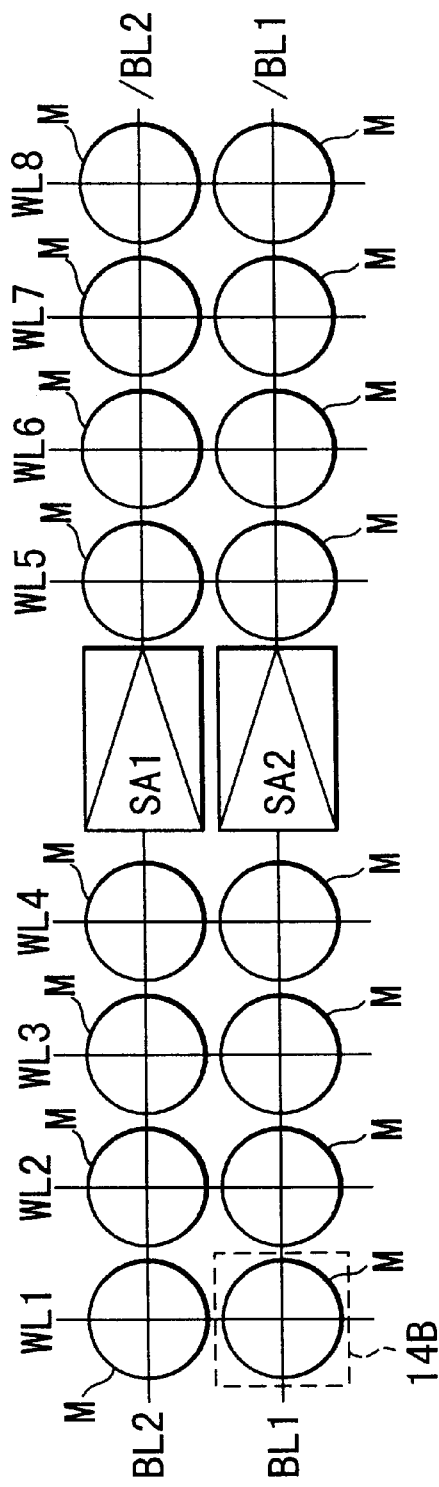
FIG. 14A is a block diagram showing the basic arrangement of the open bit-line scheme.
Figure 14B:
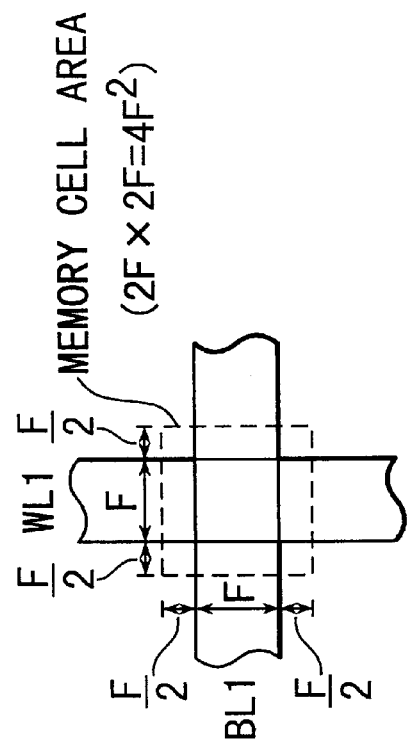
FIG. 14B is an enlarged view showing the portion within the broken line 14B in FIG. 14A.

FIG. 12 is an operation timing chart showing another example of a data read in the DRAM according to the third embodiment of the present invention.

The operation timing shown in FIG. 12 is different from the operation timing shown in FIG. 11 in the operation timing of the control signal DIVID and particularly in that the control signal DIVID is held at "L" level when the row address strobe signal /RAS is at "H" level.

The control signal DIVID changes to "H" level at time T3 after the bit line completely floats.

At time T5, the control signal DIVID changes to "L" level.

Similar to the operation timings shown in FIGS. 5 and 8, coupling noise generated on the master bit-lines /MBL1 and /MBL2 can be canceled.

According to the first to third embodiments, crosspoint-type memory cells each ideally having a cell size of $4F^2$ can be arrayed with the same arrangement as that of the folded bit-line scheme excellent in noise immunity. In addition, a restore necessary for the conventional DSB sensing scheme can be completely eliminated because the bit line having the hierarchical architecture allows to keep the sense amplifier for sensing and amplifying memory information of the memory cell in a state wherein the sense amplifier is connected to the memory cell while RAS is active.

Since a restore is eliminated, two transfer gate driving operations performed before and after a restore can be eliminated to contribute to an increase in speed.

A transfer gate between the sense amplifier and bit line at the end of the array, which is necessary in the conventional DSB sensing scheme, can be omitted to contribute to reduction in chip size.

Since the number of bit line charge/discharge operations via the sense amplifier during one cycle decreases from three times in the worst case to once, the power consumption can be reduced to about 60 to 75% the conventional one.

The present invention is not limited to the first to third embodiment, and can be variously modified within the spirit and scope of the present invention.

The present invention has been explained by exemplifying the DRAM, but can be applied to memories other than the DRAM, e.g., an FRAM adopting a dynamic differential amplifier as a bit line sense amplifier for sensing and amplifying information of the memory cell, and a PROM.

As has been described above, according to the present invention, a semiconductor integrated circuit device in which the number of bit line charge/discharge operations during one cycle can be decreased to once without any restore even with a memory cell array on which crosspoint-type memory cells are integrated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor memory device comprising:

a memory cell array divided into first and second blocks, said first block including at least first and second word lines, a first pair of segmented bit-lines crossing said first and second word lines, memory cells arranged at all intersecting points of said first and second word lines and said first pair of segmented bit-lines, and a first pair of master bit-lines of a folded bit-line scheme, said second block including at least third and fourth word lines, a second pair of segmented bit-lines crossing said third and fourth word lines, memory cells arranged at all intersecting points of said third and fourth word lines and said second pair of segmented bit-lines, and a second pair of master bit-lines of the folded bit-line scheme, one of said first pair of segmented bit-lines included in said first block being connected to one of said first pair of master bit-lines included in said first block, and the other one of said first pair of segmented bit-lines being connected to one of said second pair of master bit-lines included in said second block, and one of said second pair of segmented bit-lines included in said second block being connected to the other one of said second pair of master bit-lines included in said second block, and the other one of said second pair of segmented bit-lines being connected to the other one of said first pair of master bit-lines included in said first block;

a first sense amplifier connected to said first pair of master bit-lines;

a second sense amplifier connected to said second pair of master bit-lines; and a transfer gate connecting the other one of said first pair of master bit-lines to said one of said second pair of master bit-lines.

2. A device according to claim 1, wherein one of said first pair of segmented bit-lines and one of said second pair of segmented bit-lines are arranged at identical positions in said first and second blocks, and one of said first pair of master bit-lines and one of said second pair of master bit-lines are arranged at identical positions in said first and second blocks.

3. A device according to claim 1, wherein one of said first pair of segmented bit-lines and one of said second pair of segmented bit-lines are arranged at staggered positions in said first and second blocks, and one of said first pair of master bit-lines and one of said second pair of master bit-lines are arranged at staggered positions in said first and second blocks.

4. A device according to claim 1, wherein said transfer gate is controlled to an ON state before said first, second, third, and fourth word lines are activated, and from the ON state to an OFF state before said first and second sense amplifiers are activated.

5. A device according to claim 4, wherein said transfer gate is controlled from the OFF state to the ON state in synchronism with precharging of said first and second pairs of master bit-lines.

6. A device according to claim 1, wherein said transfer gate is controlled from an OFF state to an ON state before said word line is activated upon cancel of precharging of said pair of master bit-lines, and from the ON state to the OFF state before said sense amplifier is activated.

7. A device according to claim 1, further comprising:

a second transfer gate for electrically connecting said first sense amplifier to said first pair of master bit-lines.

8. A device according to claim 7, wherein said second transfer gate is controlled by a signal for activating a block designated by an external address.

9. A device according to claim 7, further comprising:

a second memory cell array; and a third transfer gate for electrically connecting said first sense amplifier to a pair of master bit-lines of said second memory cell array.

10. A device according to claim 1, wherein said memory cells are crosspoint-type memory cells.

11. A semiconductor memory device comprising:

first and second word lines;

first and second segmented bit-lines crossing said first and second word lines;

memory cells arranged at all intersecting points of said first and second word lines and said first and second segmented bit-lines;

third and fourth word lines;

third and fourth segmented bit-lines crossing said third and fourth word lines;

memory cells arranged at all intersecting points of said third and fourth word lines and said third and fourth segmented bit-lines;

a first master bit-line connected to said first segmented bit-line;

a second master bit-line connected to said second segmented bit-line;

a third master bit-line connected to said third segmented bit-line;

a fourth master bit-line connected to said fourth segmented bit-line;

a first sense amplifier connected between said first and third master bit-lines;

a second sense amplifier connected between said second and fourth master bit-lines; and a transfer gate connecting said fourth master bit-line to said third master bit-line.

12. A device according to claim 11, wherein said transfer gate is arranged in a region between said fourth and third master bit-lines.

13. A device according to claim 12, wherein said transfer gate is a transistor, and said first segmented bit-line crosses said third segmented bit-line via a channel of the transistor.

14. A device according to claim 11, wherein said transfer gate is controlled to an ON state before said first, second, third, and fourth word lines are activated, and from the ON state to an OFF state before said first and second sense amplifiers are activated.

15. A device according to claim 14, wherein said transfer gate is controlled from the OFF state to the ON state in synchronism with precharging of said first and second pairs of master bit-lines.

16. A device according to claim 11, wherein said transfer gate is controlled from an OFF state to an ON state before said word line is activated upon cancel of precharging of said master bit-lines, and from the ON state to the OFF state before said sense amplifier is activated.

17. A device according to claim 11, wherein said memory cells are crosspoint-type memory cells.

* * * * *